June 10, 1958 E. WOLFENDALE 2,838,664

TRANSISTOR COUNTER CIRCUIT

Filed July 14, 1954

INVENTOR
ERIC WOLFENDALE
BY [signature]
AGENT

United States Patent Office 2,838,664

Patented June 10, 1958

2,838,664

TRANSISTOR COUNTER CIRCUIT

Eric Wolfendale, Smallfield Horley, England, assignor, by mesne assignments, to North American Philips Company, Inc., New York, N. Y., a corporation of Delaware Application July 14, 1954, Serial No. 443,409

4 Claims. (Cl. 250—27)

The present invention relates to electrical digital counter circuits.

Figure 1:
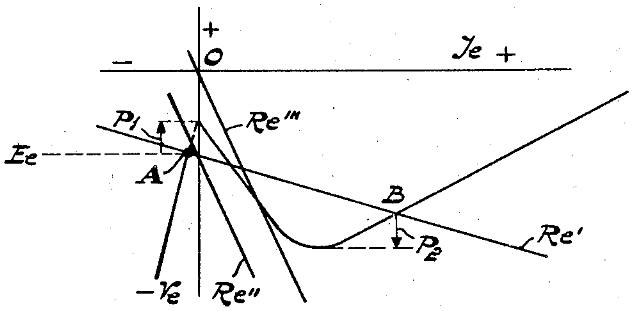

It is well known to utilize the negative resistance characteristic of transistors to obtain bistable and monostable single-transistor circuit units. Addition of an external base resistance R*b* to a point contact transistor grounded base amplifier produces a negative resistance characteristic as shown in Figure 1 of the accompanying drawing, which is a graphical presentation of emitter current $I_e$ versus emitter voltage $V_e$. The negative resistance is provided by the positive feedback in R*b* and is due to the current gain of the device. This negative resistance can be used in three ways:

(1) If the emitter load resistance is arranged ($R_e'$) to intersect the emitter characteristic at two points the transistor becomes a bistable device with an "on" state in which emitter current flows in a forward direction and an "off" state in which emitter current flows in the reverse direction.

(2) If the emitter load resistance is made greater than the negative resistance and is paralleled by a capacitor the transistor becomes a monostable device ($R_e''$).

(3) If the emitter bias of the monostable device is reduced to zero the transistor becomes an astable device ($R_e'''$).

The bistable device can be triggered from one stable state to the other; a positive voltage pulse corresponding to $P_1$ being adapted to switch the circuit from condition A to condition B, while a negative pulse corresponding to $P_2$ can effect reverse switching from condition B back to condition A. The monostable device when triggered produces a single pulse.

According to the present invention a digital counter circuit includes a plurality of bistable transistor circuit units connected in succession. The collector connection of one unit is coupled to the emitter connection of an adjacent unit through a rectifier. Pulses are applied simultaneously to the emitter connections of said units through said rectifiers. A collector impedance is so arranged in each unit that the voltage drop across such impedance, when the unit is operating in the "off" state, causes biassing of the corresponding rectifier in its reverse direction sufficiently to prevent input pulses from reaching the succeeding transistor unit, while in the "on" state increased collector current reduces said biasing of the rectifier sufficiently to permit a pulse to pass the rectifier and trigger the succeeding transistor unit from its "off" state to its "on" state.

This process may be repeated along successive transistor units, so that progressively more transistors are switched to the "on" state as the count proceeds.

Preferably, the counter has an initial transistor unit in which the input pulses are supplied to the emitter without the interposition of a rectifier.

The counter preferably includes a final unit rendered monostable, as described above, by the provision of a capacitor emitter load. Such unit provides a resetting pulse each time it is triggered to the "on" state. The resetting pulse is applied to all the units of the counter in readiness for a fresh count.

Figure 2:
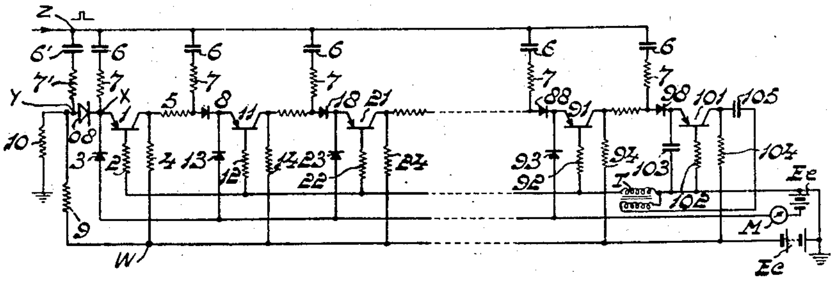

In order that the invention may be readily carried into effect, it will now be described by way of example with reference to the accompanying drawing, wherein:

Fig. 1 is a graphical presentation of the emitter characteristic of a transistor, emitter current being plotted versus emitter voltage; and Fig. 2 is a schematic diagram of a preferred embodiment of the circuit of the present invention.

A plurality of transistors 1, 11, 21 . . . 91 are arranged so that each has two stable states which will be called the "on" and the "off" states as aforementioned; the "on" state being the condition when the emitter is passing current in the forward direction and the "off" state being the condition when the emitter is passing current in the reverse direction. Semiconductor diodes 3, 13, 23 and 93 are employed as the emitter load resistances so as to prevent the emitter from going more negative than the emitter bias level $E_e$. The resistors 2, 12, 22 and 92 are the additional base resistors required to produce the necessary negative resistance characteristic, and resistors 4, 14, 24 and 94 are employed as the collector load resistances.

A final transistor 101 is arranged so that it has a stable state in the "off" condition and a semi-stable state in the "on" condition. For this purpose, a capacitor 103 is employed as the emitter load. Resistor 102 is the additional base resistance and resistor 104 is the collector load resistance.

Any desired number of transistors may be provided between the transistors 21 and 91 shown. A total of ten transistors is employed in a decade counter.

Positive input pulses are applied simultaneously to all the transistors via capacitors 6 and resistors 7.

Batteries are shown as the sources of emitter bias $E_e$ and collector potential $E_c$. Assuming that all the transistors are in the "off" state, their collector potentials will be more negative than their emitter potentials by an amount $E_c - E_e - RI_{co}$ where $RI_{co}$ is the voltage drop in a collector load resistance due to the collector cut off current $I_{co}$. Diodes 8, 18, 88 and 98 are therefore biased in their reverse direction by this potential, thus preventing the input pulses from reaching transistors 11 to 101.

Transistor 1 has no such diode and is therefore triggered to its "on" state by the first pulse. When transistor 1 is in its "on" state the increased collector current causes the collector potential of transistor 1 to approach the level of its emitter potential, and diode 8 approaches its conducting condition. The next positive pulse therefore reaches transistor 11 and triggers it into its "on" state.

Diode 18 now approaches its conducting condition and the next pulse triggers transistor 21 into its "on" state. This action continues until all the transistors apart from transistor 101 are in their "on" condition.

The next pulse triggers transistor 101 via diode 98. Transistor 101, being a monostable device, remains in the "on" condition only for a period determined by capacitor 103 and the transistor internal resistance. The positive pulse thus produced in its collector load resistance 104 is applied via a transformer T to the bases of all the other transistors; this pulse is equivalent to a negative pulse on the emitters and serves to trigger the transistors to the "off" condition. The whole process is then repeated.

The milliameter M monitors the emitter current and provides a direct indication of the state of the circuit at any time. If desired, the meter M may be calibrated so as to give an indication of the count stored.

In the circuit shown in full lines in Fig. 1, the minimum amplitude of pulse required to trigger transistors 11 to 101 differs from that required to trigger transistor 1 by the potential across the diodes 8 to 98. A diode 08 may be added and may be tied to a potential fixed by additional resistors 9 and 10 and equal to the potential at the collector of a transistor in the "on" condition. To insure uniformity with regard to the minimum pulse amplitude required, the circuit arrangement comprising the diode 08 and the resistors 9 and 10 may be connected to points W and X of the circuit of Fig. 2, as shown. With this arrangement, the input capacitor and resistors 6, 7 of transistor 1 are replaced by similar elements 6', 7' connected between point Y and point Z of the circuit of Fig. 2.

While the invention has been described by means of a specific example and in a specific embodiment, I do not wish to be limited thereto, for obvious modifications will occur to those skilled in the art without departing from the spirit and scope of the invention.

What is claimed is:

1. A transistor counter circuit comprising a plurality of transistor stages connected in cascade, each of said stages comprising a transistor having emitter, base and collector electrodes and having a first point of stable operation at a relatively low collector-base current and a second point of stable operation at a relatively high collector-base current, a rectifier element interconnecting the collector electrode of a first of said transistors and the emitter electrode of a succeeding second of said transistors, means for applying operating pulses of a given potential to the emitter electrode of said second transistor through said rectifier element, and an impedance element connected between the collector electrode of said first transistor and a point of substantially fixed potential, said impedance element and said fixed potential having values producing at the said collector of said first transistor a potential normally biasing said rectifier element to a cut-off value greater than the potential of said operating pulses when said first stage is operating at said first stable point of the characteristic thereof.

2. A transistor counter circuit comprising a plurality of transistor stages connected in cascade, each of said stages comprising a transistor having emitter, base and collector electrodes and having a first point of stable operation at a relatively low collector-base current and a second point of stable operation at a relatively high collector-base current, a plurality of resistance elements each connected between a respective one of said base electrodes and a first point of fixed potential, first rectifier elements each connected between a respective one of said emitter electrodes and a second point of fixed potential, second rectifier elements each interconnecting the collector electrode of one of said transistors and the emitter electrode of a succeeding transistor, means for applying operating pulses of a given potential to the emitter electrode of said succeeding transistors through said second rectifier elements, impedance elements each connected between the said collector electrodes and a third point of substantially fixed potential, said impedance elements and the potential of said third point having values producing at the said collector electrodes a potential normally biasing said second rectifier elements to a cut-off value greater than the potential of said operating pulses when the corresponding stage is operating at said first stable point of the characteristic thereof, a monostable transistor stage having an input circuit coupled to the last of said succeeding transistor stages and having an output circuit for producing resetting impulses, and means for applying said resetting impulses to the base electrode of the transistors of said first-mentioned stages.

3. A transistor counter circuit comprising a plurality of transistor stages connected in cascade, each of said stages comprising a transistor having emitter, base and collector electrodes and having a first point of stable operation at a relatively low collector-base current and a second point of stable operation at a relatively high collector-base current, a rectifier element interconnecting the collector electrode of a first of said transistors and the emitter electrode of a succeeding second of said transistors, means for applying operating pulses of a given potential to the emitter electrode of said second transistor through said rectifier element, an impedance element connected between the collector electrode of said first transistor and a point of substantially fixed potential, said impedance element and said fixed potential having values producing at the said collector of said first transistor a potential normally biasing said rectifier element to a cut-off value greater than the potential of said operating pulses when said first stage is operating at said first stable point of the characteristic thereof, a monostable transistor stage having an input circuit coupled to said second transistor stage and having an output circuit for producing resetting impulses, and means for applying said resetting impulses to said first and second transistor stages.

4. A transistor counter circuit comprising a plurality of transistor stages connected in cascade, each of said stages comprising a transistor having emitter, base and collector electrodes and having a first point of stable operation at a relatively low collector-base current and a second point of stable operation at a relatively high collector-base current, a first rectifier element connected to the emitter electrode of said first transistor, a second rectifier element interconnecting the collector electrode of a first of said transistors and the emitter electrode of a succeeding second of said transistors, means for applying a blocking bias to said first rectifier element, means for applying operating pulses of a given potential to the emitter electrode of said first transistor through said first rectifier element and to the emitter electrode of said second ransistor through said second rectifier element, and an impedance element connected between the collector electrode of said first transistor and a point of substantially fixed potential, said impedance element and said fixed potential having values producing at the said collector of said first transistor a potential normally biasing said rectifier element to a cut-off value greater than the potential of said operating pulses when said first stage is operating at said first stable point of the characteristic thereof.

References Cited in the file of this patent

UNITED STATES PATENTS

| | | |
|---|---|---|
| 2,591,961 | Moore et al. | Apr. 8, 1951 |
| 2,594,336 | Mohr | Apr. 29, 1952 |
| 2,614,141 | Edson | Oct. 14, 1952 |
| 2,623,170 | Dickinson | Dec. 23, 1952 |
| 2,628,310 | Wood | Feb. 10, 1953 |
| 2,644,897 | Lo | July 7, 1953 |
| 2,670,445 | Felker | Feb. 23, 1954 |